(12) United States Patent
Grab et al.

(10) Patent No.: US 12,013,584 B2
(45) Date of Patent: Jun. 18, 2024

(54) HIGH-SPEED ACTIVE CONTACT

(71) Applicant: TE Connectivity Solutions GmbH, Schaffhausen (CH)

(72) Inventors: Benjamin Michael Grab, Palmyra, PA (US); Henry Burton Piper, III, Middletown, PA (US); Soren Grinderslev, Hummelstown, PA (US)

(73) Assignee: TE Connectivity Solutions GmbH, Schaffhausen (CH)

( * ) Notice: Subject to any disclaimer, the term of this patent is extended or adjusted under 35 U.S.C. 154(b) by 0 days.

(21) Appl. No.: 17/540,692

(22) Filed: Dec. 2, 2021

(65) Prior Publication Data

US 2023/0176305 A1 Jun. 8, 2023

(51) Int. Cl.
*H04B 10/00* (2013.01)
*G02B 6/42* (2006.01)
*H05K 1/18* (2006.01)

(52) U.S. Cl.
CPC ........... *G02B 6/428* (2013.01); *G02B 6/4292* (2013.01); *H05K 1/18* (2013.01); *H05K 2201/09072* (2013.01); *H05K 2201/10121* (2013.01); *H05K 2201/10356* (2013.01); *H05K 2201/10401* (2013.01)

(58) Field of Classification Search
CPC ........ G02B 6/428; G02B 6/4292; H05K 1/18; H05K 2201/09072; H05K 2201/10121; H05K 2201/10356; H05K 2201/10401
See application file for complete search history.

(56) References Cited

U.S. PATENT DOCUMENTS

| | | | | |
|---|---|---|---|---|
| 3,790,791 A * | 2/1974 | Anderson | ............ | G02B 6/4284 250/227.24 |
| 4,595,839 A * | 6/1986 | Braun | .................. | G02B 6/4292 250/227.24 |
| 4,666,228 A * | 5/1987 | Wood | ................... | H01R 13/746 439/559 |
| 4,798,441 A * | 1/1989 | Clark | ................... | G02B 6/4292 385/88 |
| 5,448,676 A * | 9/1995 | White | .................. | G02B 6/3869 385/84 |

(Continued)

FOREIGN PATENT DOCUMENTS

FR 2691264 A1 11/1993

OTHER PUBLICATIONS

European Search Report, European App. No. 22210618.9-1020 International Filing Date Apr. 26, 2023.

*Primary Examiner* — Agustin Bello

(57) ABSTRACT

A contact comprising: (a) a contact housing, said contact housing being narrower than a cavity of a connector such that said contact housing is laterally movable within said cavity; (b) an optical interface for receiving a ferrule of a mating connector contact; (c) optoelectrical circuitry optically connected to said optical interface, wherein said optical interface and said optoelectrical circuitry are held rigidly in relation to each other within said contact housing; and (d) an electrical interface electrically connected to said optoelectrical circuitry and configured for electrical connection to a circuit board, wherein said electrical interface comprising at least a flexible cable to provide compliance between said optoelectrical circuitry and said circuit board.

8 Claims, 5 Drawing Sheets

(56) References Cited

U.S. PATENT DOCUMENTS

| | | | | |
|---|---|---|---|---|
| 6,004,044 | A * | 12/1999 | Paulus | G02B 6/4249 |
| | | | | 385/88 |
| 6,234,683 | B1 * | 5/2001 | Waldron | G02B 6/3894 |
| | | | | 385/83 |
| 6,913,402 | B2 * | 7/2005 | Bohlin | G02B 6/4248 |
| | | | | 385/53 |
| 7,093,985 | B2 * | 8/2006 | Lord | G02B 6/428 |
| | | | | 385/94 |
| 7,104,701 | B1 * | 9/2006 | Durrant | G02B 6/3878 |
| | | | | 385/74 |
| 7,255,583 | B2 * | 8/2007 | Takagi | H01R 13/6315 |
| | | | | 439/379 |
| 7,278,791 | B2 * | 10/2007 | Demaret | G02B 6/4292 |
| | | | | 385/88 |
| 7,439,449 | B1 * | 10/2008 | Kumar | H05K 1/147 |
| | | | | 174/254 |
| 7,690,849 | B2 * | 4/2010 | Scharf | G02B 6/4292 |
| | | | | 385/88 |
| 7,766,557 | B2 * | 8/2010 | Durrant | G02B 6/4204 |
| | | | | 385/88 |
| 9,081,156 | B2 * | 7/2015 | Togami | G02B 6/424 |
| 9,297,972 | B2 * | 3/2016 | Logan, Jr. | G02B 6/3831 |
| 9,819,107 | B2 * | 11/2017 | Logan, Jr. | H01R 12/91 |
| 10,180,553 | B2 * | 1/2019 | Flores | G02B 6/3897 |
| 10,281,657 | B2 * | 5/2019 | Sullivan | G02B 6/4292 |
| 10,302,876 | B2 * | 5/2019 | Grinderslev | G02B 6/3879 |
| 10,734,743 | B2 * | 8/2020 | Logan, Jr. | H01R 12/91 |
| 10,782,494 | B2 * | 9/2020 | Logan, Jr. | G02B 6/423 |
| 10,925,159 | B2 | 2/2021 | Chen et al. | |
| 2006/0008213 | A1 * | 1/2006 | Lord | G02B 6/4281 |
| | | | | 385/94 |
| 2011/0275246 | A1 * | 11/2011 | Kooiman | H01R 13/65918 |
| | | | | 439/620.22 |
| 2013/0039622 | A1 * | 2/2013 | Grinderslev | G02B 6/3874 |
| | | | | 385/61 |
| 2013/0121648 | A1 * | 5/2013 | Hung | G02B 6/4293 |
| | | | | 385/79 |
| 2013/0216189 | A1 * | 8/2013 | Grinderslev | G02B 6/3879 |
| | | | | 385/78 |
| 2014/0029900 | A1 * | 1/2014 | Logan, Jr. | G02B 6/3821 |
| | | | | 29/874 |
| 2015/0147911 | A1 * | 5/2015 | Logan, Jr. | H01R 12/91 |
| | | | | 29/842 |
| 2015/0355418 | A1 * | 12/2015 | Grinderslev | G02B 6/3869 |
| | | | | 385/61 |
| 2016/0202428 | A1 * | 7/2016 | Grinderslev | G02B 6/3874 |
| | | | | 385/11 |
| 2019/0361182 | A1 * | 11/2019 | Logan | G02B 6/4292 |

* cited by examiner

HIGH-SPEED ACTIVE CONTACT

FIELD OF INVENTION

The present invention relates generally to the field of fiber optic connectors, and, more particularly, to a high speed active contact having compliance to accommodate a mating connector contact.

BACKGROUND

Optical fiber connectors are a critical part of essentially all optical fiber communication systems. For instance, such connectors are used to join segments of fiber into longer lengths, to connect fiber to active devices, such as radiation sources, detectors, and repeaters, and to connect fiber to passive devices, such as switches, multiplexers, and attenuators. The principal function of an optical fiber connector is to hold the fiber end such that the fiber's core is axially aligned with an optical pathway of the mating structure. This way, light from the fiber is optically coupled to the optical pathway.

Of particular interest herein, are multi-cavity connectors. Such connectors typically comprise an outer housing defining a plurality of cavities for holding inner assemblies or "contacts." Over the years, multi-cavity connectors have evolved into ruggedized connector systems, comprising an outer housing which is configured to mate with the outer housing of a mating connector, typically through a screw connection. Numerous United States Military specifications describe such multi-cavity connectors and fiber optic terminals, including, for example, MIL-DTL-38999, MIL-PRF-29504, and MIL-DTL-5015, among others.

Recently one or more of the contacts in a multi-cavity connector are active contacts. An active contact is a well-known component in the industry of active fiber optic products and transceivers, and functions to convert between optical and electrical signals. A typical active contact has a fiber optic termini on the one end for receiving a mating optical connector, and an electrical connector on the opposite end for electrical connection to a printed circuit board. Between the optic termini and the electrical connector are electrical-to-optical conversion circuits which convert between optical signals and electrical signals. This circuitry is referred to herein as optoelectrical circuitry. A particularly popular active contact is the Size 8 (aka Quadrax after the copper QUadrax contact that fits in same cavity) Active Contact, which is a six-conductor active contact used in the Aerospace and other fields in which reliable and rugged connectors are required.

One challenge facing such active contacts is the need to accommodate misalignment between the optical termini of the contact and the fiber/ferrule of a mating connector contact during mating. More specifically, the optical coupling between the optical termini and the mating connector contact typically requires precise alignment a high degree of precision—i.e., within microns. However, there is often a significant misalignment between the mating connector contact and the optical termini of contact during mating. To accommodate this, conventional contacts have a certain degree of radial and axial float allowing the optical termini to move to accommodate the misalignment of the mating connector contact during the mating process.

Although conventional active contacts have been configured to provide such radial and axial compliance, Applicant recognizes that such configurations have significant shortcomings. For example, the configurations disclosed in U.S. Pat. No. 10,872,494 provide radial and axial compliance by means of complex moving parts inside the contact. Specifically, these patents disclose a configuration in which the optoelectrical circuitry is segregated into different components some of which essentially float within the contact by virtue of a flexible electrical cable between the optoelectrical components.

Although this configuration provides for both radial and axial compliance during mating, Applicant recognizes that optoelectrical circuitry components floating within the contact is not only overly complex, but also subject to damage, especially in high vibration applications. Therefore, Applicant has identified the need for an active contact that provides for compliance for mating, but which is simplified and more rugged. The present invention fulfills this need, among others.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Applicant recognizes that the compliance of the contact can be simplified to improve the reliability and ruggedness of the contact. Specifically, Applicant recognizes that, in most applications, axial compliance between the mating connector contact and the active contacts can be accommodated by the mating connector contact, allowing the active contact in the connector to be fixed along the z axis. Specifically, a biased ferrule or similar configuration of the mating connector contact can accommodate the needed axial compliance between the mating connector contact and the active contact, and thereby provide the necessary bias to maintain physical contact or to otherwise maintain the mating connector contact's alignment along the z axis. Additionally, Applicant recognizes that the ruggedness and simplicity of the contact can be improved by rigidly fixing the position of the optoelectrical circuitry with the optical termini. In other words, rather than having the optoelectrical circuitry move with relation to the optical termini, Applicant's approach fixes these two in relation to one another and instead provides for a flexible electrical interface. Not only is this approach simpler, but it also provides for more robust package.

Accordingly, one embodiment of the invention is a connector comprising: (a) a housing defining at least one cavity; (b) a contact within the at least one cavity, the contact having a front and rear orientation, and comprising at least, (i) a contact housing, the contact housing being narrower than the at least one cavity and resiliently disposed within the at least one cavity such that the contact housing is laterally movable within the cavity to accommodate lateral offset of a mating connector contact; (ii) an optical interface for receiving a ferrule of the mating connector contact; (iii) optoelectrical circuitry optically connected to the optical interface, wherein the optical interface and the optoelectrical circuitry are held rigidly in relation to each other within the contact housing; and (iv) an electrical interface electrically connected to the optoelectrical circuitry and configured for electrical connection to a circuit board, wherein the electrical interface comprising at least a flexible cable to provide compliance between the optoelectrical circuitry and the circuit board.

Another embodiment of the invention is a contact for use with a connector having a housing defining at least one cavity, the contact having a front and rear orientation, and comprising: (a) a contact housing, the contact housing being narrower than the at least one cavity such that the contact housing is laterally movable within the cavity to accommodate lateral offset of a mating connector contact; (b) an optical interface for receiving a ferrule of the mating connector contact; (c) optoelectrical circuitry optically connected to the optical interface, wherein the optical interface and the optoelectrical circuitry are held rigidly in relation to each other within the contact housing; and (d) an electrical interface electrically connected to the optoelectrical circuitry and configured for electrical connection to a circuit board, wherein the electrical interface comprising at least a flexible cable to provide compliance between the optoelectrical circuitry and the circuit board.

DETAILED DESCRIPTION

Figure 1:
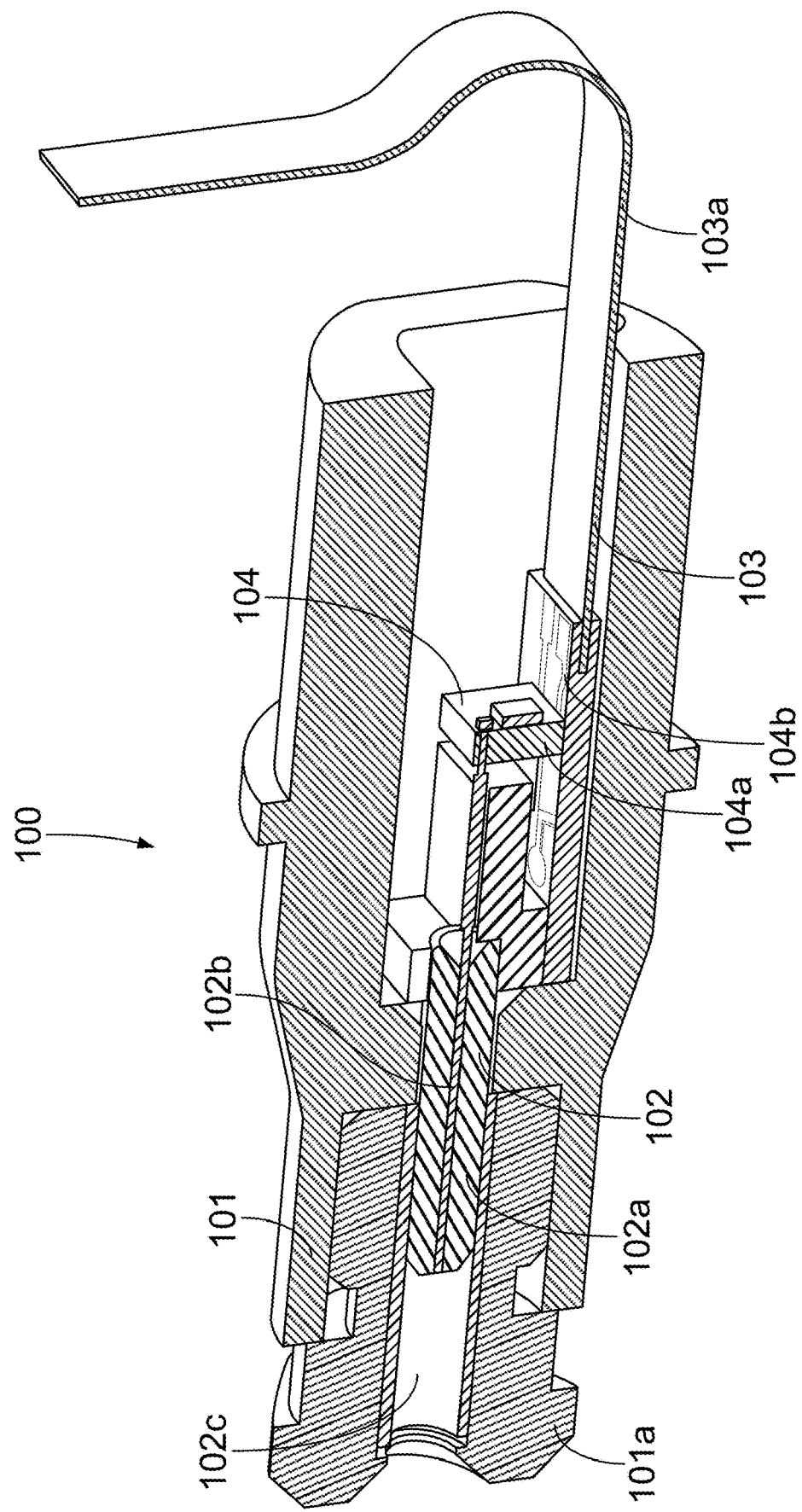
FIG. 1 is a cross-sectional, perspective view of one embodiment of the contact of the present invention.
Figure 2:
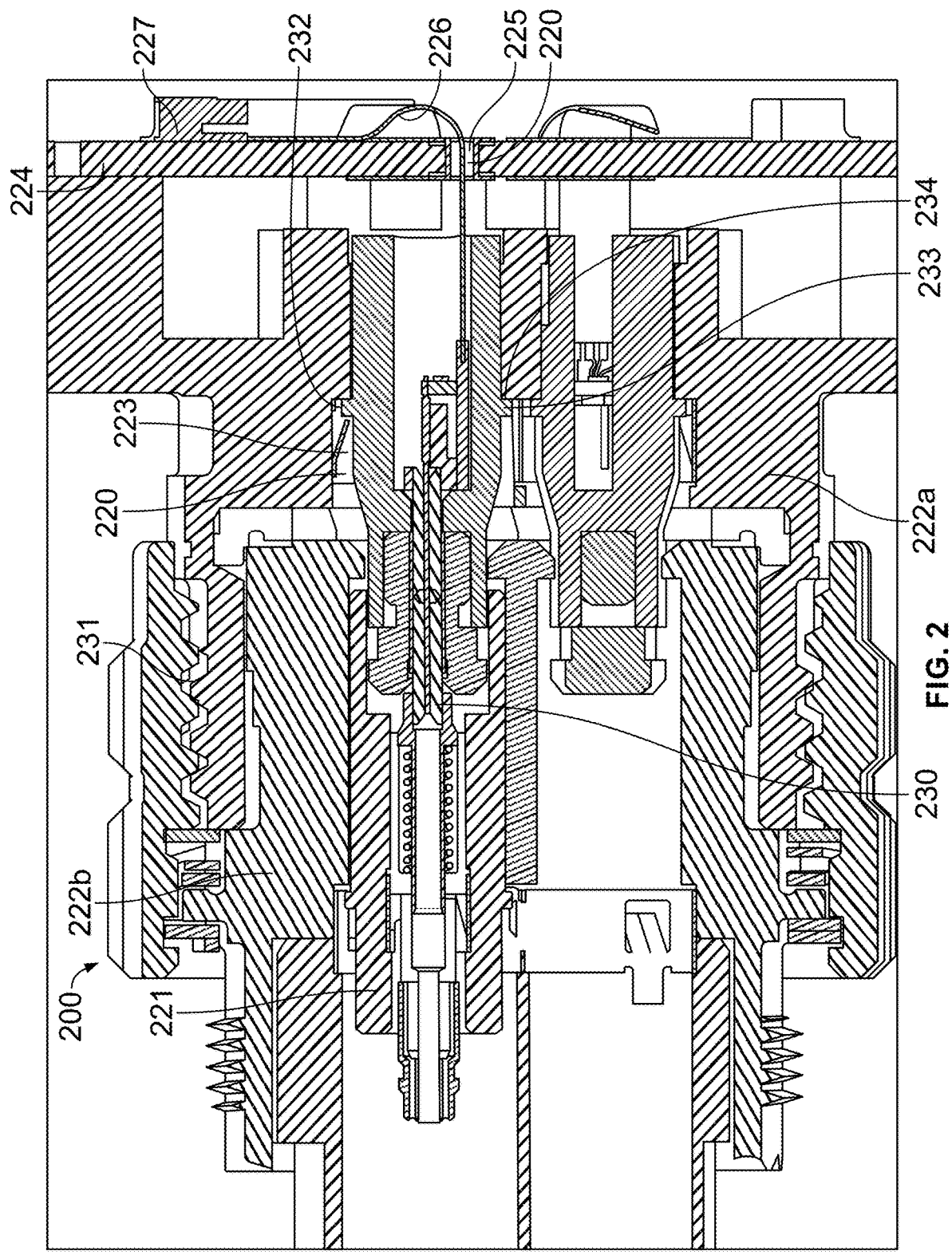
FIG. 2 is a cross-sectional view of one embodiment of a connector of the present invention having multiple cavities occupied by the contact of FIG. 1.
Figure 3:
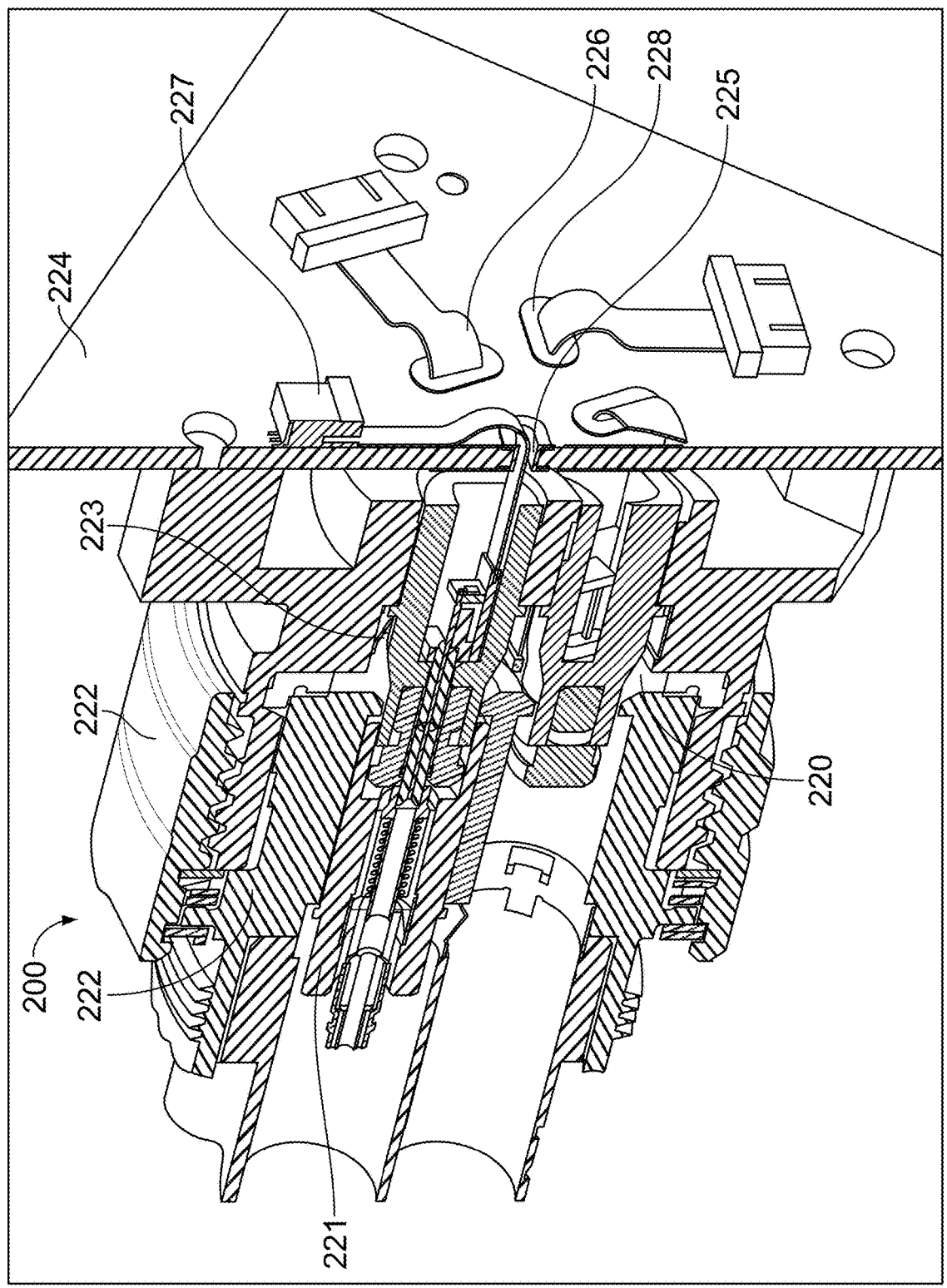
FIG. 3 is a cross-sectional perspective view of the connector shown in FIG. 2.

Referring to FIGS. 1-3, one embodiment of the connector 200 of the present invention is shown. The connector 200 comprises a housing 222 defining one or more cavities 220. Disposed in one of the cavities 220 is a contact 100, having a front and rear orientation. The contact 100 comprises a contact housing 101. The contact housing is narrower than the cavity and resiliently disposed within therein such that the contact housing is laterally movable within the cavity to accommodate lateral offset of a mating connector contact 221. The contact 100 comprises an optical interface 102 for receiving a ferrule 230 of the mating connector contact 221. The contact 100 also comprises optoelectrical circuitry 104 optically connected to the optical interface, wherein the optical interface and the optoelectrical circuitry are held rigidly in relation to each other within the contact housing. The contact also comprises an electrical interface 103 electrically connected to the optoelectrical circuitry 104 and configured for electrical connection to a circuit board 224. The electrical interface 103 comprising at least a flexible cable 103a to provide compliance between the optoelectrical circuitry and the circuit board. These features are considered below in greater detail, and with respect to selected alternative embodiments.

The housing 222 functions to define one or more cavities for holding one or more contacts in relation to the circuit board 224. For example, in one embodiment, the housing 222 defines four discrete cavities 220 for holding four contacts. Such housings are known in the art, and, consequently, will not be described in detail herein. Suffice to say that in one embodiment, a socket portion 222a of the housing 222 is secured to the circuit board via fasteners or other known means. The socket portion 222a contains the contacts. A plug portion 222b, which houses the mating connector contacts, is configured to plug into the socket portion 222a. Commonly, but not necessarily, the plug portion secures to the second portion using a screw mechanism 231.

The cavity 220 defined by the housing has a larger circumference than that of the contact housing to allow for radial movement of the contact within the cavity. More specifically, in one embodiment, when the contact is centered within the cavity, there is a gap 232 around the contact which allows the contact freedom to move laterally. In one embodiment, to keep the contact biased in the center of the cavity, a spring member 223 is disposed in the cavity 220 and is configured to urge against the contact around its perimeter to center the contact within the cavity. Although a spring member 223 is shown in this embodiment, it should be understood that other embodiments are possible to resiliently position the contact in the center of the cavity. For example, rather than a spring member, elastic material may be disposed in the cavity between the contact and the wall the cavity. Still other alternative embodiments will be obvious to those of skill in the art in light of this disclosure.

In this particular embodiment, the contact is configured to be held axially within the housing 222. Specifically, the contact housing comprises a ridge 233, and the spring member 223 is configured to bias the ridge 233 rearward such that it contacts a shoulder 234 of the housing 222, thereby holding the contact housing 101 in a constant axial position with respect to the housing 222.

The contact of the present invention is an active contact and functions to optically connect with a mating connector contact and convert between electrical and optical signals. The functionality of such active contact is known. For example, in one embodiment, the contact is a high speed active Quadrax contact. In one embodiment, the connector is configured with multiple cavities to accommodate multiple contacts. In one embodiment, all of the contacts are the same. In an alternative embodiment, at least two of the contacts are different types of contacts. For example, one contact may be an active contact and there other contact may be an electrical contact. Still other embodiments will be obvious to those of skill the art in light of this disclosure.

In one embodiment, the contact housing comprises a discrete front portion 101a as shown in FIG. 1. The front portion 101a, in this embodiment, houses a ferrule receiving bore 102c (discussed below). Such an embodiment facilitates manufacturing, although, other embodiments are possible within the scope of the invention. For example, in one embodiment, the front portion 101a is integrated with the main contact housing 101. Those of skill in the art in light of this disclosure will be able to optimize the contact housing for manufacturability and performance.

The optical interface 102 functions to optically couple with a mating connector contact. In one embodiment, the optical interface 102 of the present invention is a conventional optical interface. For example, as shown in FIGS. 1-3, the optical interface may be a conventional physical contact optical interface comprising a ferrule 102a holding a fiber 102b, and a ferrule-receiving bore 102c for receiving the mating ferrule 230. Alternatively, the optical interface 102 may be an expanded beam optical interface in which the beam between the mating connector contact and the optical interface is expanded to enhance coupling performance. The expanded beam optical interface may involve physical contact and/or air gap(s). Expanded beam connectors are well-known and will not be described herein in detail. Still other optical interfaces will be obvious to those of skill in the art in light of this disclosure.

The optoelectrical circuitry 104 functions to convert between optical and electrical signals. Such circuitry is known. For example, in the embodiment of FIG. 1, optoelectrical circuitry 104 comprises an interposer 104 to which fiber 102b is optically coupled. The interposer 104 is mounted perpendicularly to a circuit board 104b. Such a configuration is known and disclosed for example in U.S. application Ser. No. 16/450,189. Although this embodiment shows a configuration of an interposer perpendicular to a circuit board, it should be understood that other embodiments are possible including, for example, having the interposer parallel to the circuit board.

An important feature of this embodiment of the present invention is that the optical interface 102 is rigidly held relative to the optoelectrical circuitry 104. As mentioned above, Applicant recognizes that such packaging provides for a more robust connector. In one embodiment, as shown in FIG. 1, the optical interface and the optoelectrical circuitry are affixed rigidly to the contact housing. Alternatively, the optical interface 102 and the optoelectrical circuitry 104 may be combined in a unitary subassembly which is disposed in contact 100. For example, in one embodiment, the optoelectrical circuitry 104 may be potted with the tail end of the optical interface to form a robust hermetically sealed package. Still other embodiments will be obvious to those of skill in the art in light of this disclosure.

The electrical interface 103 functions not only to provide an electrical connection between the optoelectrical circuitry 104 and the circuit board 224, but also to provide compliance to allow the contact 100 to move within the cavity 220 of the housing 222. To this end, in one embodiment, the electrical interface 103 comprises a flexible cable 103a. In one embodiment, the flexible cable comprises flexible printed circuit.

The configuration of this cable may vary. For example, in one embodiment, the flexible cable 103a extends rearwardly from the contact and is electrically connected to the circuit board either by connectorized connections or by soldering. More specifically, the distal end of the flexible cable 103a may be terminated with a connector 227, which is then coupled to a receiving connector on the circuit board. Such connectors are well-known and include, for example, a ZIF connector or other small connector. Alternatively, the distal end of the cable 103a may be bar soldered to the circuit board using known techniques. Still other means of electrically connecting the distal end of the flexible cable 103a to the circuit board will be known to those of skill in the art in light of this disclosure.

Figure 5A:
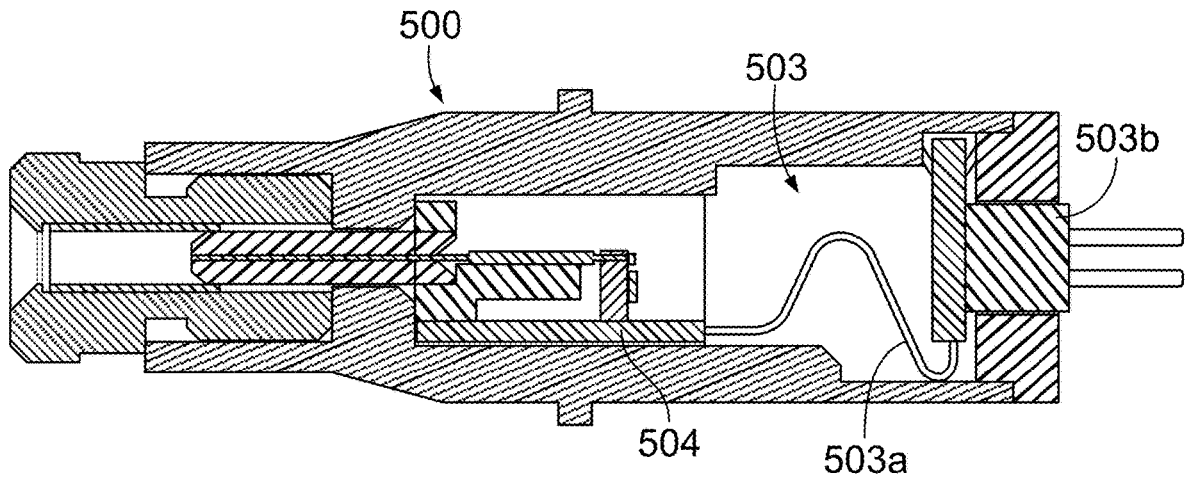
FIG. 5A is a cross-sectional view of an alternative embodiment of the contact of the present invention.
Figure 5B:
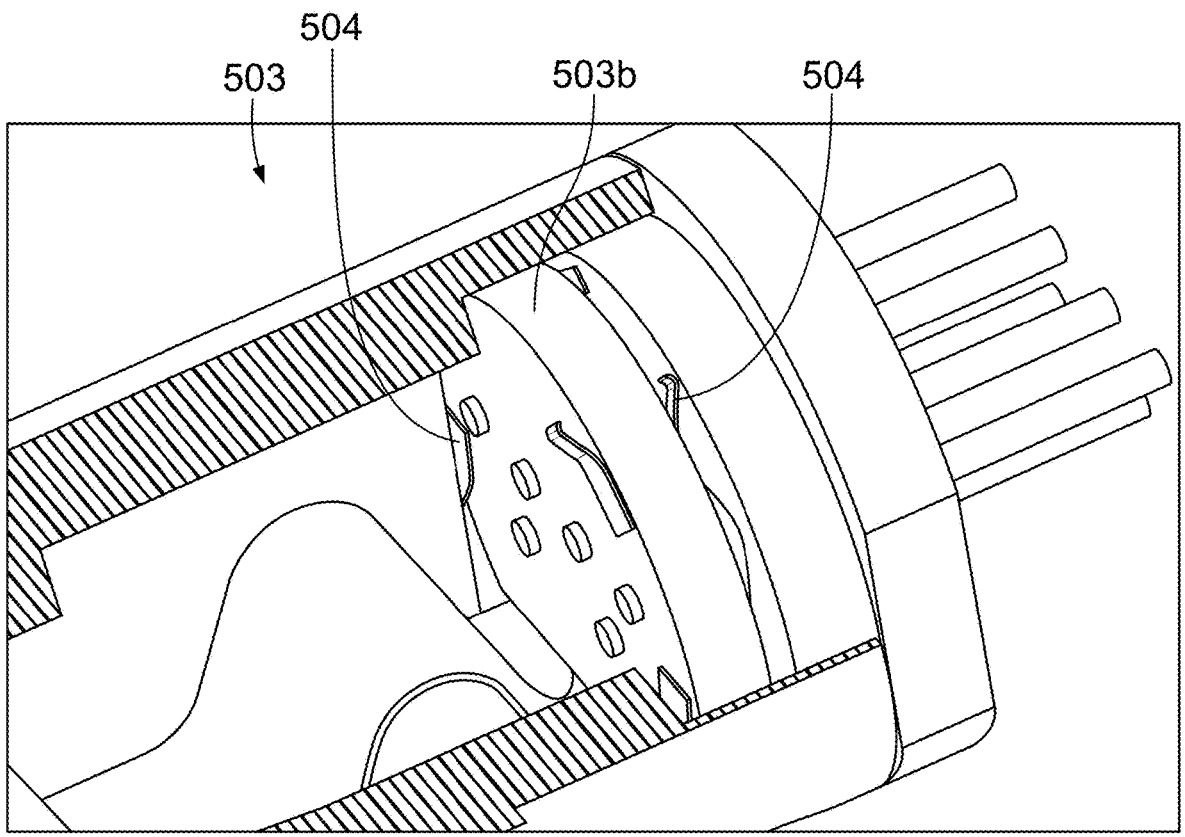
FIG. 5B is a close-up, perspective view of the electrical interface of the embodiment of FIG. 5A.

Alternatively, rather than the distal end of the flexible cable 103a being electrically connected to the circuit board, in another embodiment, the flexible cable 103a does not extend from the contact 100, but rather connects the optoelectrical circuitry 104 to an electrical connector disposed at the rear end of the contact. More specifically, referring to FIG. 5A, one embodiment of an alternative embodiment of the contact 500 having an electrical interface 503 is shown. In this embodiment, the electrical interface 503 comprises a pin connector 503b which is electrically couple to the optoelectrical circuitry 504 with the flexible cable 503a. In one embodiment, the pin connector 503b is configured to float within the contact housing 501. More specifically, as shown in FIG. 5b, which is a close-up view of the electrical interface 503 of the embodiment of FIG. 5A, the pin connector 503b is centrally biased within the contact housing 501 by resilient member(s) 504. Thus, pin connector 503b can move radially with respect to the contact housing 501. It should be understood this is just one alternative embodiment of the electrical interface 103 and that other alternative embodiments will be obvious to those of skill in the art in light of this disclosure.

Figure 4:
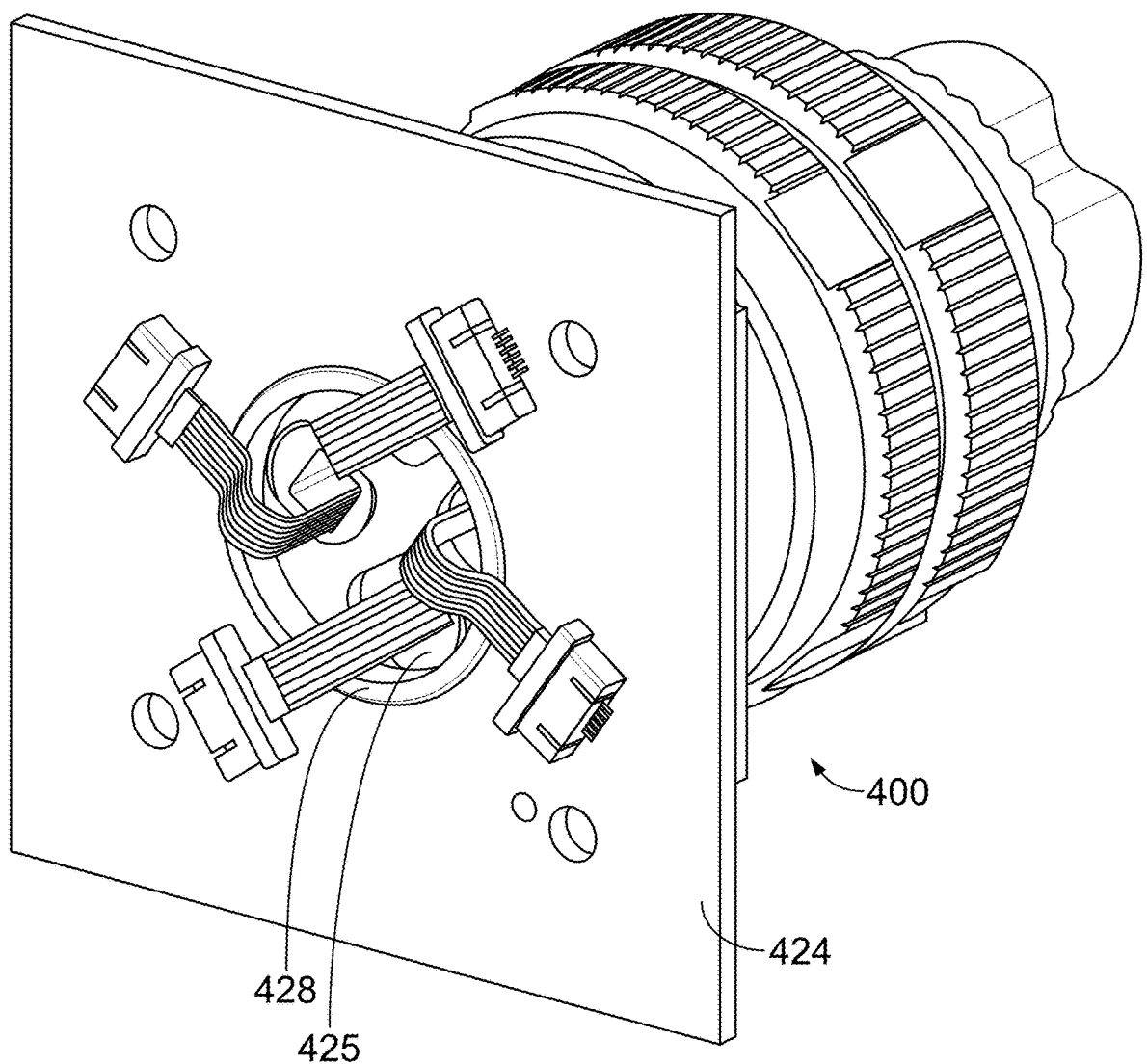
FIG. 4 is a perspective view of an alternative configuration of the connector of the present invention.

The electrical interface 103 involves various embodiments of connection to the circuit board 224. In one embodiment, shown in FIGS. 1-3, the circuit board has first and second sides, 224a, 224b, respectively, with the connector housing 222 being mounted to the first side 224a, and the electrical interface 104 electrically connected to the second side to 224b of the circuit board 222. In one embodiment, the flexible cable 103a of each contact passes through a discrete opening 225 defined in the circuit board 224. To protect against chafing, in one embodiment, a grommet 228 is inserted in the opening 225. Alternatively, in one embodiment, rather than having discrete openings for each flexible cable extending from each contact, a common opening may be used as shown in FIG. 4. Specifically, FIG. 4 shows a connector 400 having a circuit board 424 with a single opening 425 through which all of the flexible cables of each contact pass. As with the individual discrete openings, in one embodiment, a grommet 428 is used to prevent chafing of the optical cables. Still other embodiments will be obvious to those of skill in the art in light of this disclosure.

Referring back to FIGS. 3 and 4, in one embodiment, the flexible cable forms a service bend 226 to accommodate movement of the contact relative to the housing 222. More specifically, due to the necessary minimum bend radius of the cable, the right angle bend of the cable between the contact and its electrical connection to the circuit board 224 results in an accommodating bend in the cable, which is referred herein as the service bend 226. This service bend 226 allows for movement contact relative to the circuit board with little resistance. As mentioned above, this relative movement is necessary to accommodate any misalignment between the mating connector contact and the contact of the present invention.

These and other advantages maybe realized in accordance with the specific embodiments described as well as other variations. It is to be understood that the above description is intended to be illustrative, and not restrictive. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

What is claimed is:

1. A connector comprising:
   a housing defining at least one cavity;
   a contact within said at least one cavity, said contact having a front and rear orientation, and comprising at least,
   a contact housing, said contact housing being narrower than said at least one cavity and resiliently disposed within said at least one cavity such that said contact housing is laterally movable within said cavity to accommodate lateral offset of a mating connector contact;
   an optical interface for receiving a ferrule of said mating connector contact;
   optoelectrical circuitry optically connected to said optical interface, wherein said optical interface and said optoelectrical circuitry are held rigidly in relation to each other within said contact housing; and an electrical interface electrically connected to said optoelectrical circuitry and configured for electrical connection to a circuit board, wherein said electrical interface comprising at least a flexible cable to provide compliance between said optoelectrical circuitry and said circuit board;

a circuit board, and wherein said flexible cable is electrically connected to said circuit board, wherein said circuit board defines and at least one opening and a first and second side, wherein said housing is mounted on said first side, wherein said flexible cable is electrically connected to said circuit board on said second side, and wherein said flexible cable passes through said at least one opening.

2. The connector of claim 1, further comprising a gromet disposed around said opening.

3. The connector of claim 1, wherein said flexible cable bends about 90° forming a service bend for accommodating movement of said contact.

4. The connector of claim 1, wherein said flexible cable is hot-bar soldered to said circuit board.

5. The connector of claim 1, wherein said flexible cable is terminated with a cable connector.

6. The connector of claim 5, wherein said cable connector is a ZIF connector.

7. The connector of claim 1, wherein said at least one opening is a common opening through which each flexible cable of each contact passes.

8. The connector of claim 1, wherein said at least one opening comprises a plurality of openings wherein each flexible cable of each contact passes through one of said plurality of openings.

* * * * *